United States Patent
Inoue et al.

(10) Patent No.: US 10,950,410 B2
(45) Date of Patent: Mar. 16, 2021

(54) MULTIPLE ELECTRON BEAM INSPECTION APPARATUS WITH THROUGH-HOLE WITH SPIRAL SHAPE

(71) Applicant: NuFlare Technology, Inc., Yokohama (JP)

(72) Inventors: Kazuhiko Inoue, Yokohama (JP); Atsushi Ando, Edogawa-ku (JP); Munehiro Ogasawara, Hiratsuka (JP)

(73) Assignee: NuFlare Technology, Inc., Yokohama (JP)

(*) Notice: Subject to any disclaimer, the term of this patent is extended or adjusted under 35 U.S.C. 154(b) by 0 days.

(21) Appl. No.: 16/686,316

(22) Filed: Nov. 18, 2019

(65) Prior Publication Data
US 2020/0176216 A1    Jun. 4, 2020

(30) Foreign Application Priority Data
Dec. 4, 2018   (JP) .............................. JP2018-227658

(51) Int. Cl.
*H01J 37/145*   (2006.01)
*H01J 37/20*    (2006.01)
*H01J 37/28*    (2006.01)

(52) U.S. Cl.
CPC .......... *H01J 37/145* (2013.01); *H01J 37/20* (2013.01); *H01J 37/28* (2013.01);
(Continued)

(58) Field of Classification Search
CPC .......... H01J 37/145; H01J 37/20; H01J 37/28; H01J 2237/2443; H01J 2237/121; H01J 2237/14
See application file for complete search history.

(56) References Cited

U.S. PATENT DOCUMENTS

| | | | | |
|---|---|---|---|---|
| 4,928,010 A | * | 5/1990 | Saito | .................... H01J 37/28 250/310 |
| 5,362,964 A | * | 11/1994 | Knowles | ............... H01J 37/228 250/310 |

(Continued)

FOREIGN PATENT DOCUMENTS

| CN | 103858201 A | 8/2014 |
|----|----|----|
| JP | 61-101944 A | 5/1986 |
| TW | 201812289 A | 4/2018 |

OTHER PUBLICATIONS

Taiwanese Office Action dated Nov. 25, 2020 in Taiwanese Application No. 108141135 with English Machine Translation, 8 pgs.

*Primary Examiner* — Brooke Purinton
(74) *Attorney, Agent, or Firm* — Oblon, McClelland, Maier & Neustadt, L.L.P.

(57) ABSTRACT

Provided is a multiple electron beam inspection apparatus including: an irradiation source irradiating a substrate with multiple electron beams; a stage on which is cable of mounting the substrate; an electromagnetic lens provided between the irradiation source and the stage, the electromagnetic lens generating a lens magnetic field, the multiple electron beams being capable of passing through the lens magnetic field; an electrostatic lens provided in the lens magnetic field, the electrostatic lens including a plurality of through-holes and a plurality of electrodes, the plurality of through-holes having wall surfaces respectively, each of the multiple electron beams being capable of passing through the corresponding each of the plurality of through-holes, each of the plurality of electrodes provided on each of the wall surfaces of the plurality of through-holes, at least one of the through-holes provided apart from a central axis of trajectory of the multiple electron beams having a spiral shape; and a power source connected to the electrodes.

8 Claims, 8 Drawing Sheets

(52) U.S. Cl.
CPC ..... *H01J 2237/121* (2013.01); *H01J 2237/14* (2013.01); *H01J 2237/2443* (2013.01)

(56) References Cited

U.S. PATENT DOCUMENTS

| | | | | |
|---|---|---|---|---|
| 6,172,364 | B1* | 1/2001 | Ogasawara | H01J 3/40 |
| | | | | 250/310 |
| 8,362,427 | B2* | 1/2013 | Nishimura | H01J 37/244 |
| | | | | 250/310 |
| 9,315,663 | B2* | 4/2016 | Appleby | B22C 9/10 |
| 2012/0112089 | A1* | 5/2012 | Lang | H01J 37/02 |
| | | | | 250/396 R |

* cited by examiner

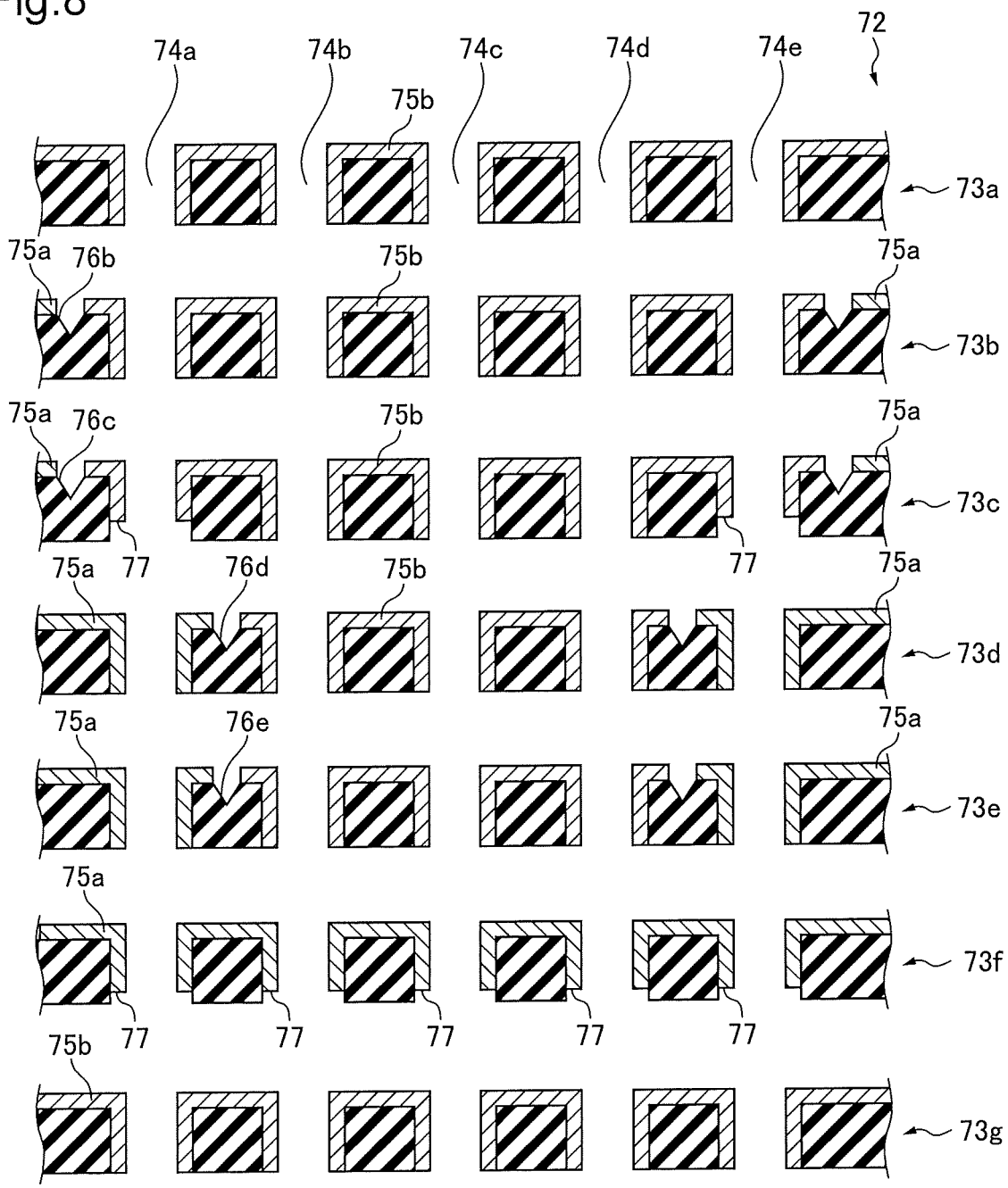

MULTIPLE ELECTRON BEAM INSPECTION APPARATUS WITH THROUGH-HOLE WITH SPIRAL SHAPE

CROSS-REFERENCE TO RELATED APPLICATION

This application is based upon and claims the benefit of priority from Japanese Patent Applications No. 2018-227658, filed on Dec. 4, 2018, the entire contents of which are incorporated herein by reference.

FIELD OF THE INVENTION

Embodiments relate to a multiple electron beam inspection apparatus.

In recent years, with the high integration and large capacity of large scale integrated circuits (LSIs), the line width of a circuit required for a semiconductor element has become narrower and narrower. In addition, it is essential to improve the yield for the manufacture of LSIs which requires a lot of manufacturing cost. However, as represented by 1-gigabit class random access memory (DRAM), the pattern constituting the LSI is in the order of submicrometer to nanometer. In recent years, with the miniaturization of the dimensions of LSI patterns formed on semiconductor wafers, the dimensions to be detected as pattern defects have become extremely small. Therefore, there is a need to improve the accuracy of a pattern inspection apparatus that inspects defects of an ultrafine pattern transferred onto the semiconductor wafer. In addition, as one of the major factors for lowering the yield, there is a pattern defect of a mask used at the time of exposing and transferring an ultrafine pattern on a semiconductor wafer by photolithography. For this reason, there is a need to improve the accuracy of a pattern inspection apparatus that inspects defects of a transfer mask used in LSI manufacturing.

As an inspection method, there has been known a method of performing inspection by comparing a measurement image obtained by imaging a pattern formed on a substrate such as a semiconductor wafer or a lithography mask with design data or a measurement image obtained by imaging the same pattern on the substrate. For example, as a pattern inspection method, there are "die to die (die-die) inspection" of comparing measurement image data obtained by imaging the same pattern at different positions on the same substrate and "die to database (die-database) inspection" of generating design image data (reference image) on the basis of design data with a pattern designed and comparing the design image data with a measurement image which is measurement data obtained by imaging the pattern. The captured image is transmitted to the comparison circuit as measurement data. After alignment of the images, the comparison circuit compares the measurement data and the reference data according to an appropriate algorithm, and in a case where the data do not match, it is determined that there is a pattern defect.

With respect to the pattern inspection apparatus described above, in addition to an apparatus for irradiating an inspection target substrate with a laser beam and capturing a transmission image or a reflection image, development of an inspection apparatus for acquiring a pattern image by scanning an inspection target substrate with an electron beam and detecting secondary electrons emitted from the inspection target substrate caused by the irradiation of the electron beam is also in progress. With respect to an inspection apparatus using electron beams, development of an apparatus using multiple electron beams is also in progress.

In the multiple electron beam inspection apparatus using the multiple electron beams described above, there is a problem in that, as the electron beam with which the target object is irradiated is separated away from the optical axis, there occurs a difference in the spot diameter of the electron beam with the influence of the curvature of field. In addition, due to this difference, there has been a problem that field of view (FOV) cannot be enlarged.

SUMMARY OF THE INVENTION

According to an aspect of embodiments, there is provided a multiple electron beam inspection apparatus including: an irradiation source irradiating a substrate with multiple electron beams; a stage on which is cable of mounting the substrate; an electromagnetic lens provided between the irradiation source and the stage, the electromagnetic lens generating a lens magnetic field, the multiple electron beams being capable of passing through the lens magnetic field; an electrostatic lens provided in the lens magnetic field, the electrostatic lens including a plurality of through-holes and a plurality of electrodes, the plurality of through-holes having wall surfaces respectively, each of the multiple electron beams being capable of passing through the corresponding each of the plurality of through-holes, each of the plurality of electrodes provided on each of the wall surfaces of the plurality of through-holes, at least one of the through-holes provided apart from a central axis of trajectory of the multiple electron beams having a spiral shape; and a power source connected to the electrodes.

BRIEF DESCRIPTION OF THE DRAWINGS

FIG. 8 is a schematic cross-sectional view of an insulating plate and a conductive film constituting the electrostatic lens in the embodiment.

DETAILED DESCRIPTION OF THE EMBODIMENTS

Hereinafter, in an embodiment, a multiple electron beam inspection apparatus will be described.

Embodiment

Figure 1:
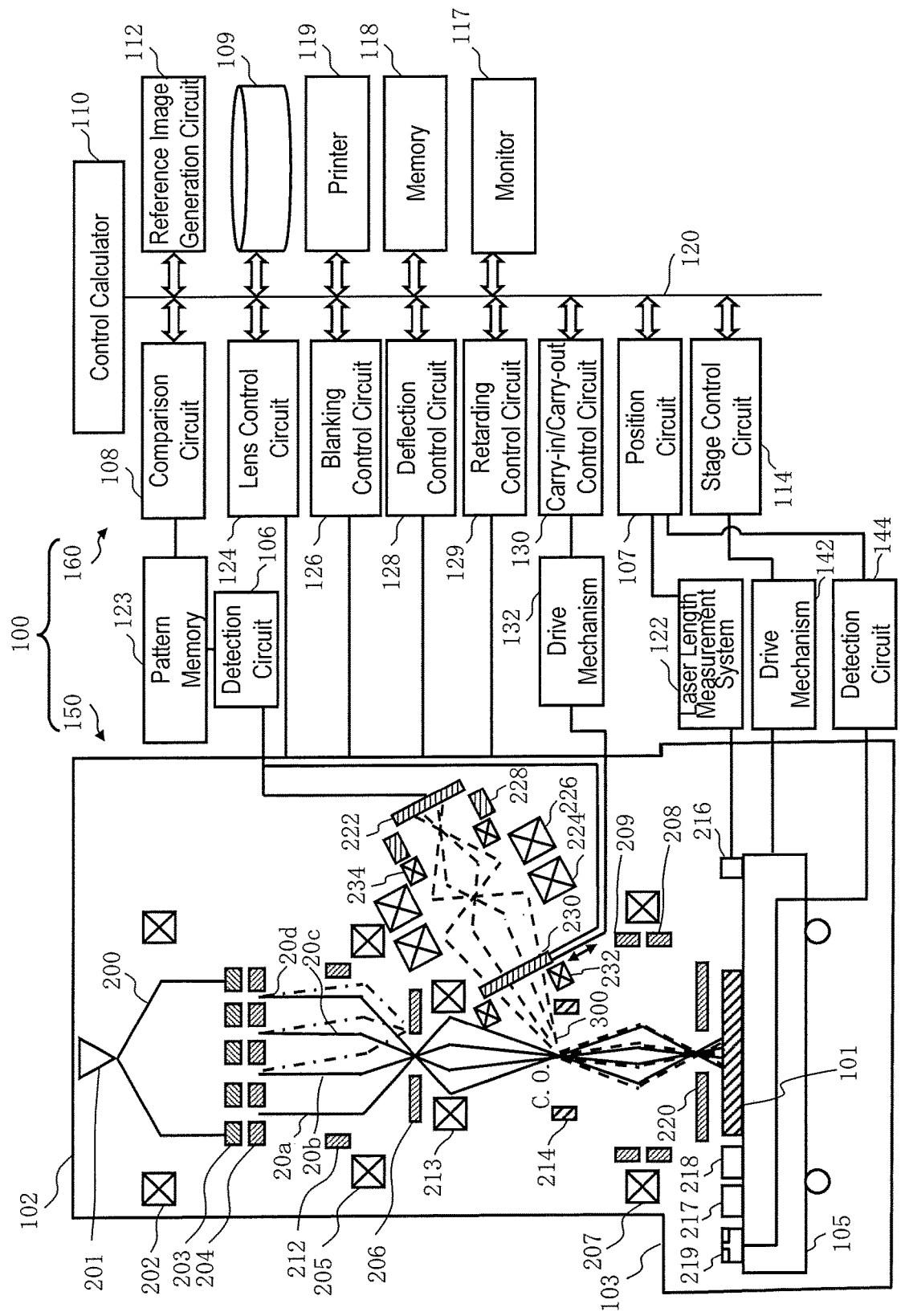
FIG. 1 is a schematic diagram illustrating a configuration of a multiple electron beam inspection apparatus according to an embodiment.

FIG. 1 is a configuration diagram illustrating a configuration of a pattern inspection apparatus according to an embodiment. In FIG. 1, an inspection apparatus 100 which inspects a pattern formed on a substrate is an example of an image acquisition apparatus. The inspection apparatus 100 includes an image acquisition mechanism 150 and a control system circuit 160 (control unit). The image acquisition mechanism 150 includes an electron beam column 102 multiple beam electron lens barrel), an inspection chamber 103, a detection circuit 106, a pattern memory 123, a drive mechanism 132, a drive mechanism 142, and a laser length measurement system 122. In the electron beam column 102, an electron gun 201 (irradiation source), an illumination lens 202, a shaping aperture array substrate 203, a blanking aperture array mechanism 204, a reduction lens 205, a limiting aperture substrate 206, an objective lens 207, a main deflector 208, a sub deflector 209, a collective blanking deflector 212, reduction lens 213, a beam separator 214, an electrode 220, a multiple detector 222, projection lenses 224 and 226, a deflector 228, a wide-area detector 230, and alignment coils 232 and 234 are disposed.

In the inspection chamber 103, an XY stage 105 (stage) that is movable at least on the XY plane is disposed. A substrate 101 to be inspected is disposed on the XY stage 105. The substrate 101 includes a mask substrate for exposure and a semiconductor substrate such as a silicon wafer. In a case where the substrate 101 is the semiconductor substrate, a plurality of chip patterns (wafer dies) are formed on the semiconductor substrate. In a case where the substrate 101 is the mask substrate for exposure, chip patterns are formed on the mask substrate for exposure. A plurality of chip patterns (wafer dies) are formed on the semiconductor substrate by exposing and transferring the chip patterns formed on the mask substrate for exposure onto the semiconductor substrate several times. Hereinafter, a case where the substrate 101 is the semiconductor substrate will be mainly described. The substrate 101 is disposed on the XY stage 105, for example, with a pattern formation surface facing upward. In addition, on the XY stage 105, a mirror 216 for reflecting a laser beam for laser length measurement irradiated from a laser length measurement system 122 disposed outside the inspection chamber 103 is disposed. In addition, on the XY stage 105, marks 217 and 218 having different mark patterns and a transmission mark 219 with a limited beam incident area are disposed. The surface heights of the marks 217 and 218 and the transmission mark 219 are preferably matched to the surface height of the substrate 101.

The multiple detector 222 and the wide-area detector 230 are connected to the detection circuit 106 outside the electron beam column 102. The detection circuit 106 is connected to the pattern memory 123. In addition, the electron beam column 102 and the inspection chamber 103 are evacuated by a vacuum pump (not illustrated) to form a vacuum state.

As the wide-area detector 230, for example, a semiconductor detector, a photoelectron detector connected with a plastic scintillator with a film formed on the surface to prevent charging can be used, or an ammeter connected on a plate simply made of a conductor can also be used. In this case, from the viewpoint of accuracy of inflow current measurement, it is advantageous to use a material with low secondary electron generation efficiency such as carbon for the surface.

For example, a primary electron optics is configured with the illumination lens 202, the shaping aperture array substrate 203, the reduction lens 205, the reduction lens 213, the objective lens 207, the main deflector 208, and the sub deflector 209. However, embodiments are not limited thereto, and the primary electron optics may include other coils, lenses, deflectors, or the like. In addition, for example, a secondary electron optics is configured with the beam separator 214, the projection lenses 224 and 226, the deflector 228, and the alignment coils 232 and 234. However, embodiments are not limited thereto, and the secondary electron optics may include other coils, lenses, deflectors, or the like.

In the control system circuit 160, a control calculator 110 for controlling the entire inspection apparatus 100 is connected to a position circuit 107, a comparison circuit 108, a reference image generation circuit 112, a stage control circuit 114, a lens control circuit 124, a blanking control circuit 126, a deflection control circuit 128, a retarding control circuit 129, a carry-in/carry-out control circuit 130, a detection circuit 144, storage devices 109 such as a magnetic disk device, a monitor 117, a memory 118, and a printer 119 via a bus 120.

The pattern memory 123 is connected to the comparison circuit 108. In addition, the XY stage 105 is driven by the drive mechanism 142 under the control of the stage control circuit 114. In the drive mechanism 142, for example, a drive system such as a 3-axis (X-Y-θ) motor which drives in the X direction, the Y direction, and the θ direction is configured, and thus, the XY stage 105 is movable. As these X motor, Y motor, and θ motor (not illustrated), for example, step motors can be used. The XY stage 105 is movable in the width direction and the rotation direction by motors of axes of X, Y, and θ. Then, the movement position of the XY stage 105 is measured by the laser length measurement system 122 and supplied to the position circuit 107. The laser length measurement system 122 measures the position of the XY stage 105 by the principle of laser interferometry by receiving the reflected light from the mirror 216.

A high voltage power supply circuit (not illustrated) is connected to the electron gun 201, and along with the application of an acceleration voltage from the high voltage power supply circuit between a filament (not illustrated) and an extraction electrode (anode) in the electron gun 201, by the application of a voltage of a predetermined extraction electrode (Wehnelt) and the heating of the cathode at a predetermined temperature, a group of the electrons emitted from the cathode is accelerated to be emitted as the electron beam 200. As the illumination lens 202, the reduction lens 205, the reduction lens 213, the objective lens 207, and the projection lenses 224 and 226, for example, electromagnetic lenses are used, and all the lenses are controlled by the lens control circuit 124. In addition, the beam separator 214 is also controlled by the lens control circuit 124. Each of the collective blanking deflector 212 and the deflector 228 is configured with an electrode group of at least two poles and is controlled by the blanking control circuit 126. Each of the main deflector 208 and the sub deflector 209 is configured with an electrode group having at least four poles and is controlled by the deflection control circuit 128. The electrode 220 is configured on a disk in which a passage hole penetrating in the center portion is formed, and is controlled together with the substrate 101 by the retarding control circuit 129.

Herein, FIG. 1 illustrates a configuration necessary for describing the embodiment. The inspection apparatus 100 may normally have other necessary configurations.

Figure 2:
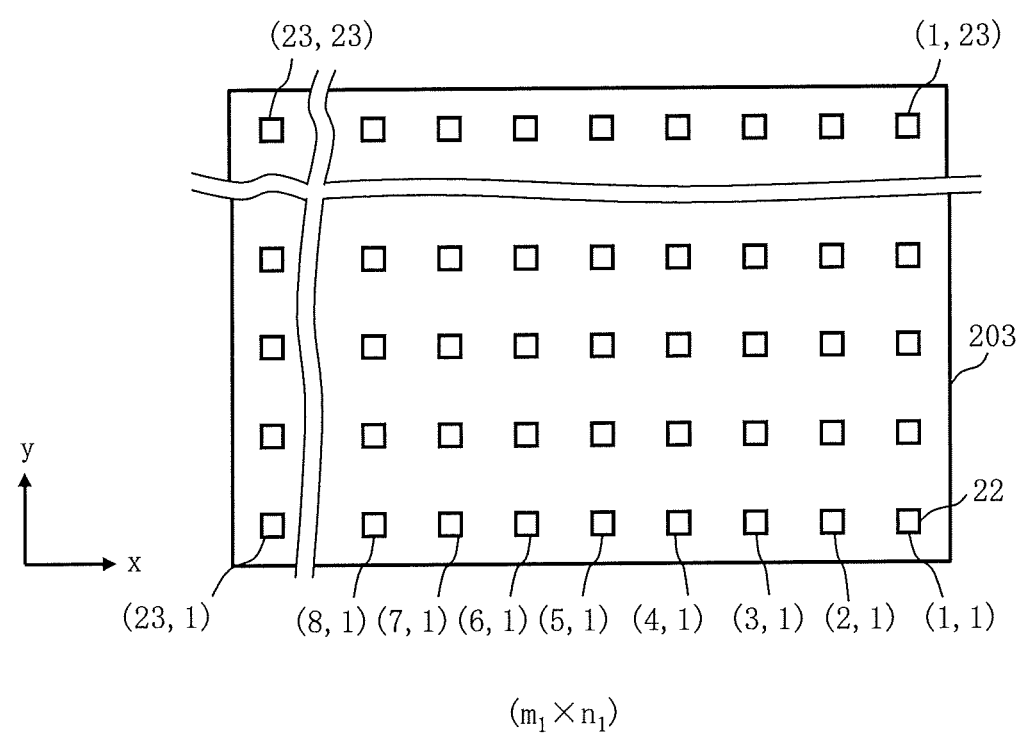
FIG. 2 is a conceptual diagram illustrating a configuration of a shaping aperture array substrate in the embodiment.

FIG. 2 is a conceptual diagram illustrating a configuration of a shaping aperture array substrate in the embodiment. In FIG. 2, in the shaping aperture array substrate 203, holes (openings) 22 of a two-dimensional shape of width (x direction) $m_1$ columns×length (y direction) $n_1$ stages ($m_1$ and $n_1$ are integers of 2 or more) are formed in the x and y directions at a predetermined arrangement pitch. In the example of FIG. 2, a case where 23×23 holes are formed is illustrated, but in the embodiment, for example, 5×5 holes (openings) 22 are formed. The number of holes 22 arranged is not limited thereto. Each hole 22 is formed in a circular shape having the same outer diameter. Alternatively, the holes may have rectangular shapes having the same size and shape. A portion of the electron beam 200 passes through the plurality of holes 22 to form the multiple electron beams 20. Herein, the example where the holes 22 having two or more columns in both the width and length directions (x and y directions) are disposed is illustrated, but embodiments are not limited thereto. For example, a plurality of columns may be arranged in one of the width and length directions (x and y directions), and one column may be arranged in the other direction. In addition, the arrangement method of the holes 22 is not limited to a case where the holes are disposed in a grid shape in the width and length directions as illustrated in FIG. 2. For example, the holes of the k-th column and the holes of the (k+1)-th column in the length direction (y direction) may be disposed to be shifted by a dimension "a" in the width direction (x direction). Similarly, the holes of the (k+1)-th column and the holes of the (k+2)-th column in the length direction (y direction) may be disposed to be shifted by a dimension "b" in the width direction (x direction).

Next, operations of the image acquisition mechanism 150 in the inspection apparatus 100 will be described.

The entire shaping aperture array substrate 203 is illuminated almost vertically with the electron beam 200 emitted from the electron gun 201 (emission source) by the illumination lens 202. As illustrated in FIG. 2, a plurality of holes 22 (openings) having a rectangular shape are formed in the shaping aperture array substrate 203, and the area including all of the plurality of holes 22 is illuminated with the electron beam 200. The respective portions of the electron beam 200 with which the positions of the plurality of holes 22 are irradiated pass through the plurality of holes 22 of the shaping aperture array substrate 203 so that a plurality of electron beams (multiple beams) 20a to 20d (solid lines in FIG. 1) having, for example, a rectangular shape are formed.

The formed multiple beams 20a to 20d (primary electron beams) pass through the blanking aperture array mechanism 204, are reduced by the reduction lens 205, and travel toward a central hole formed in the limiting aperture substrate 206. Herein, in a case where the entire multiple beams 20a to 20d are collectively deflected by the collective blanking deflector 212 disposed between the shaping aperture array substrate 203 (blanking aperture array mechanism 204) and the reduction lens 205, the position is shifted from the hole at the center of the limiting aperture substrate 206 and is shielded by the limiting aperture substrate 206. On the other hand, the multiple beams 20a to 20d that have not been deflected by the collective blanking deflector 212 pass through the hole at the center of the limiting aperture substrate 206 as illustrated in FIG. 1. By turning ON/OFF the collective blanking deflector 212, blanking control is performed, so that ON/OFF of the beam is collectively controlled. Therefore, the limiting aperture substrate 206 shields the multiple beams 20a to 20d deflected so as to be in the beam OFF state by the collective blanking deflector 212. Then, the multiple beams 20a to 20d for inspection are formed by the beam group that is formed from the time of the beam ON to the time of the beam OFF and passes through the limiting aperture substrate 206.

The multiple beams 20a to 20d that have passed through the limiting aperture substrate 206 are refracted toward the optical axis by the reduction lens 213 to form a crossover (C.O.). Then, after passing through the beam separator 214 disposed at the crossover position of the multiple electron beams 20, the multiple beams travel to the objective lens 207. The multiple beams 20a to 20d that have passed through the beam separator 214 are focused on the surface of the substrate 101 by the objective lens 207, and images of the multiple beams 20a to 20d (electron beams) are formed on the substrate 101. At this time, the multiple beams 20a to 20d become pattern images (beam diameters) having a desired reduction ratio, and the entire multiple electron beams 20 that have passed through the limiting aperture substrate 206 are collectively deflected to the same direction by the main deflector 208 and the sub deflector 209 and pass through the passage hole at the center of the electrode 220, and each irradiation position on the substrate 101 is irradiated with each beam. In such a case, the main deflector 208 collectively deflects the entire multiple electron beams 20 to the reference position of the mask die scanned by the multiple electron beams 20. In the case of performing scanning while continuously moving the XY stage 105, tracking deflection is further performed so as to follow the movement of the XY stage 105. Then, the sub deflector 209 collectively deflects the entire multiple electron beams 20 so that each beam scans the corresponding area. The multiple electron beams 20 irradiated at a time are ideally arranged at a pitch obtained by multiplying the arrangement pitch of the plurality of holes 22 of the shaping aperture array substrate 203 by the desired reduction ratio (1/a) described above. Accordingly, the electron beam column 102 irradiates the substrate 101 with the two-dimensional $m_1 \times n_1$ multiple electron beams 20 at a time. A bundle of secondary electrons (multiple secondary electrons 300) (dotted lines in FIG. 1) including reflected electrons corresponding to each beam of the multiple electron beams 20 is emitted from the substrate 101 due to the irradiation of a desired position of the substrate 101 with the multiple electron beams 20.

Herein, a voltage is applied between the electrode 220 and the substrate 101 by the retarding control circuit 129 so that the incident energy of the primary electron beams on the desired substrate can be obtained. Similarly to the electron beam column 102, the electrode 220 is set to the ground potential, and the substrate 101 is set to a predetermined negative potential. Accordingly, the primary electron beams (multiple electron beams 20) accelerated with high energy are decelerated immediately before entering the substrate 101 under vacuum, and the low-energy secondary electrons (multiple secondary electrons 300) emitted from the substrate 101 can be accelerated toward the multiple detector 222 side.

The multiple secondary electrons 300 emitted from the substrate 101 pass through the passage hole of the electrode 220, are refracted toward the center of the multiple secondary electrons 300 by the objective lens 207, and travel to the beam separator 214.

Herein, the beam separator 214 (for example, a Wien filter) generates an electric field and a magnetic field in directions perpendicular to each other in a plane perpendicular to the direction (optical axis) in which the multiple electron beams 20 travel. The electric field exerts a force in the same direction regardless of the traveling direction of the electrons. In contrast, the magnetic field exerts a force according to Fleming's left-hand rule. For this reason, the directions of the forces exerted on the electrons can be changed according to the penetration direction of the electrons. With respect to the multiple electron beams 20 (primary electron beams) penetrating into the beam separator 214 from the upper side, the force by the electric field and the force by the magnetic field cancel each other, and thus, the multiple electron beams 20 travel straight downward. On the other hand, with respect to the multiple secondary electrons 300 penetrating into the beam separator 214 from the lower side, both the force by the electric field and the force by the magnetic field are exerted in the same direction, and thus, the multiple secondary electrons 300 are bent obliquely upward.

The multiple secondary electrons 300 which are bent obliquely upward are projected onto the multiple detector 222 while being refracted by the projection lenses 224 and 226 in a state where the wide-area detector 230 is not carried in the optical path. The multiple detector 222 detects the projected multiple secondary electrons 300. The multiple detector 222 includes, for example, a diode-type two-dimensional sensor (not illustrated). Then, at the position of the diode-type two-dimensional sensor corresponding to each beam of the multiple electron beams 20, each secondary electron of the multiple secondary electrons 300 collides with the diode-type two-dimensional sensor to generate electrons, and thus, secondary electron image data is generated for each pixel described later. In a case where the scanning operation is performed while the XY stage 105 is moving, the deflector 228 deflects the multiple secondary electrons 300 (tracking controls) so as to follow the movement of the XY stage 105, so that the detection position of each secondary electron of the multiple secondary electrons 300 in the multiple detector 222 is not shifted with the movement of the XY stage 105.

As described above, in the inspection apparatus 100, the primary electron optics that adjusts the trajectory (irradiation position, focus, and the like) of the multiple electron beams 20 (primary electron beams) and the secondary electron optics that adjusts the trajectory (irradiation position, focus, and the like) of the multiple secondary electrons 300 (secondary electrons) are disposed. However, in the state where the primary electron optics and the secondary electron optics are not adjusted (beam adjustment), the electron trajectory as described above cannot usually be obtained. For this reason, it is necessary to adjust the primary electron optics and the secondary electron optics.

Figure 3:
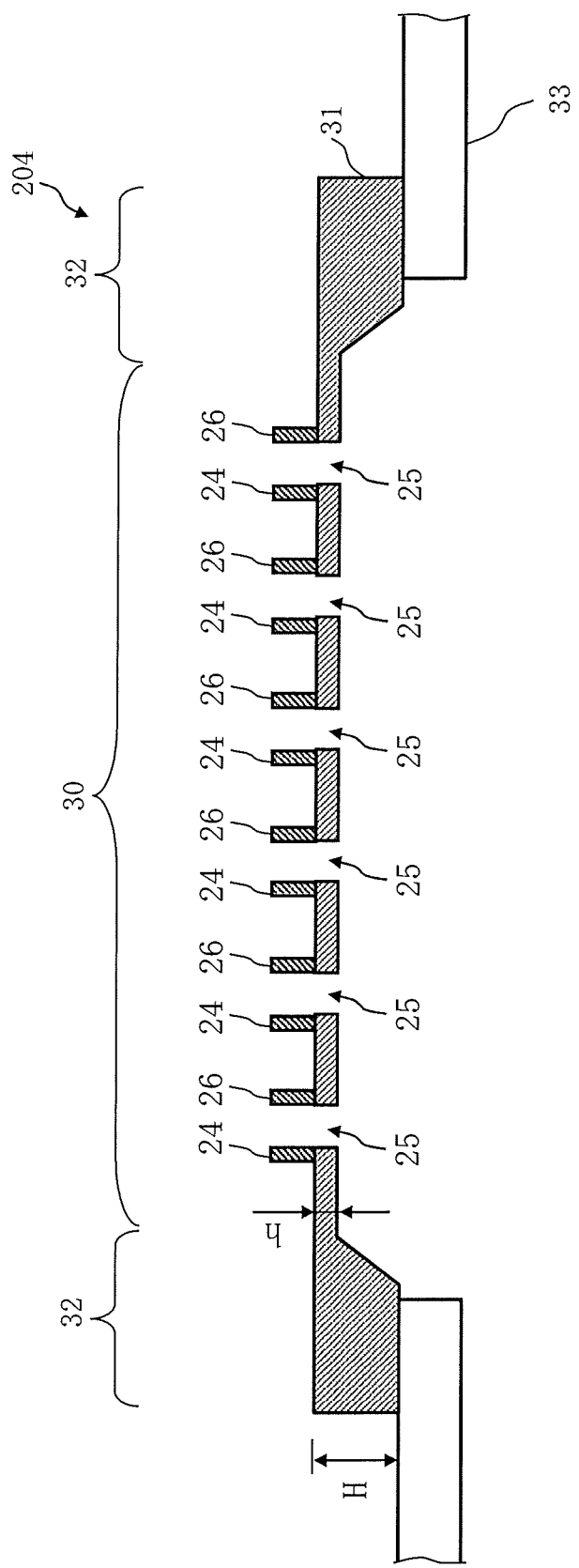
FIG. 3 is a cross-sectional view illustrating a configuration of a blanking aperture array mechanism in the embodiment.

FIG. 3 is a cross-sectional view illustrating the configuration of the blanking aperture array mechanism in the embodiment. In the blanking aperture array mechanism 204, as illustrated in FIG. 3, a substrate 31 made of, for example, silicon or the like is disposed on a support base 33. For example, the central portion of the substrate 31 is thinly cut from the back surface side and processed into a membrane region 30 (first region) having a thin film thickness h. The periphery surrounding the membrane region 30 is an outer peripheral region (second region) having a thick film thickness H. It is preferable that the upper surface of the membrane region 30 and the upper surface of the outer peripheral region 32 are formed so as to have the same height position or substantially the height position. The substrate 31 is held on the support base 33 on the back surface of the outer peripheral region 32. The central portion of the support base 33 is open, and the position of the membrane region 30 is located in the open area of the support base 33.

In the membrane region 30, passage holes 25 (openings) for passage of the respective beams of the multiple electron beams 20 are opened at positions corresponding to the respective holes 22 of the shaping aperture array substrate 203 illustrated in FIG. 2. In other words, in the membrane region 30 of the substrate 31, a plurality of the passage holes 25 through which the corresponding beams of the multiple beams using electron beams pass are formed in an array shape. Then, a plurality of electrode pairs, each of which has two electrodes, are disposed on the membrane region 30 of the substrate 31 at positions facing each other across the corresponding passage hole 25 among the plurality of passage holes 25. Specifically, as illustrated in FIG. 3, on the membrane region 30, sets (blankers: blanking deflectors) of control electrode 24 for blanking deflection and counter electrode 26 interposing the passage hole 25 are respectively disposed at positions in the vicinity of the passage holes 25. In addition, wirings (not illustrated) for applying a deflection voltage to the each control electrode 24 for the passage hole 25 are formed on the substrate 31. The blanking control circuit 126 controls ON/OFF of application of the individual deflection voltage to each control electrode 24. In addition, the counter electrode 26 for each beam is grounded.

Figure 4:
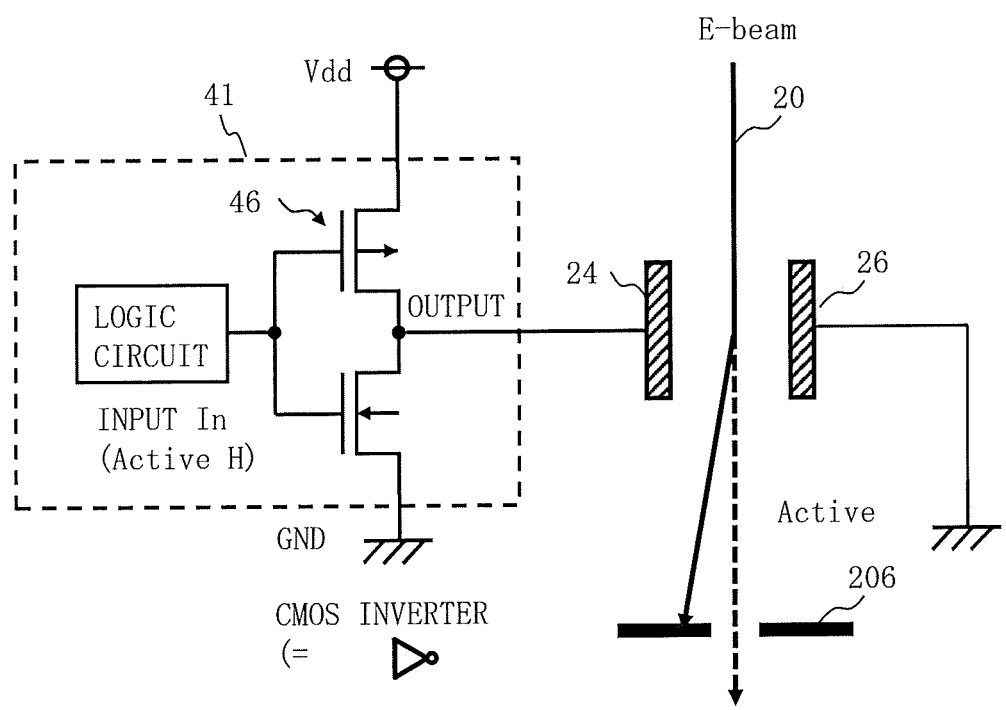
FIG. 4 is a diagram illustrating an example of an individual blanking mechanism in the embodiment.

FIG. 4 is a diagram illustrating an example of the individual blanking mechanism in the embodiment. In FIG. 4, an individual control circuit 41 for individually applying a deflection voltage to each control electrode 24 is formed in the blanking control circuit 126. In each individual control circuit 41, an amplifier 46 (an example of a switching circuit) is disposed. In the example of FIG. 4, a complementary MOS (CMOS) inverter circuit is disposed as an example of the amplifier 46. Then, the CMOS inverter circuit is connected to a positive potential (Vdd: blanking potential: first potential) (for example, 5 V) (first potential) and a ground potential (GND: second potential). An output line (OUT) of the CMOS inverter circuit is connected to the control electrode 24. On the other hand, a ground potential is applied to the counter electrode 26.

The input (IN) of the CMOS inverter circuit is applied with any one of an L (low) potential (for example, a ground potential) that is lower than a threshold voltage and an H (high) potential (for example, 1.5 V) that is equal to or higher than the threshold voltage as a control signal. In the embodiment, in a state where the L potential is applied to the input (IN) of the CMOS inverter circuit, the output (OUT) of the CMOS inverter circuit becomes the positive potential (Vdd), and since the corresponding multiple electron beam 20 is deflected by the electric field due to the potential difference from the ground potential of the counter electrode 26 and is shielded by the limiting aperture substrate 206, control is performed so that the beam is off. On the other hand, in a state (active state) where the H potential is applied to the input (IN) of the CMOS inverter circuit, the output (OUT) of the CMOS inverter circuit becomes the ground potential, and since the corresponding multiple electron beam 20 is not deflected due to the disappearance of the potential difference from the ground potential of the counter electrode 26 and is allowed to pass through the limiting aperture substrate 206, control is performed so that the beam is on.

The multiple electron beams 20 passing through the respective passage holes are individually deflected by the voltages applied to the two control electrodes 24 and the counter electrode 26 which are independently paired. Blanking is controlled by such deflection. Specifically, the set of the control electrode 24 and the counter electrode 26 individually blanks and deflects the corresponding beam of the multiple beams by the potential switched by the CMOS inverter circuit serving as the corresponding switching circuit. In this manner, the plurality of blankers perform blanking deflection of the corresponding beams among the multiple beams that have passed through the plurality of holes 22 (openings) of the shaping aperture array substrate 203.

As the individual blanking mechanism, the above-described CMOS circuit in the blanking control circuit 126 may not be formed on the substrate. For example, a simple power supply circuit including a DC power source and a relay circuit is disposed in the blanking control circuit 126 so that a desired potential is controlled to be applied from the blanking control circuit 126 to each electrode of the blanking aperture array mechanism 204. In addition, driving circuits such as the above-described CMOS circuit can be directly formed in the individual blanking aperture array mechanism in which the control electrodes 24 and 26 and the passage holes are formed.

The individual blanking control of each beam by the blanking aperture array mechanism 204 is used when the optics of the inspection apparatus 100 is adjusted. During normal pattern inspection after adjusting the optics, all the beams are controlled to be turned on. Then, during the normal pattern inspection, the beam ON/OFF of the multiple electron beams 20 is collectively controlled by the collective blanking deflector 212. Incidentally, by synchronizing the blankers of the blanking aperture array mechanism 204 and performing ON/OFF control of all the beams at the same timing, the same operation as that of the collective blanking deflector 212 can be performed. In such a case, the collective blanking deflector 212 may be omitted.

Figure 5:
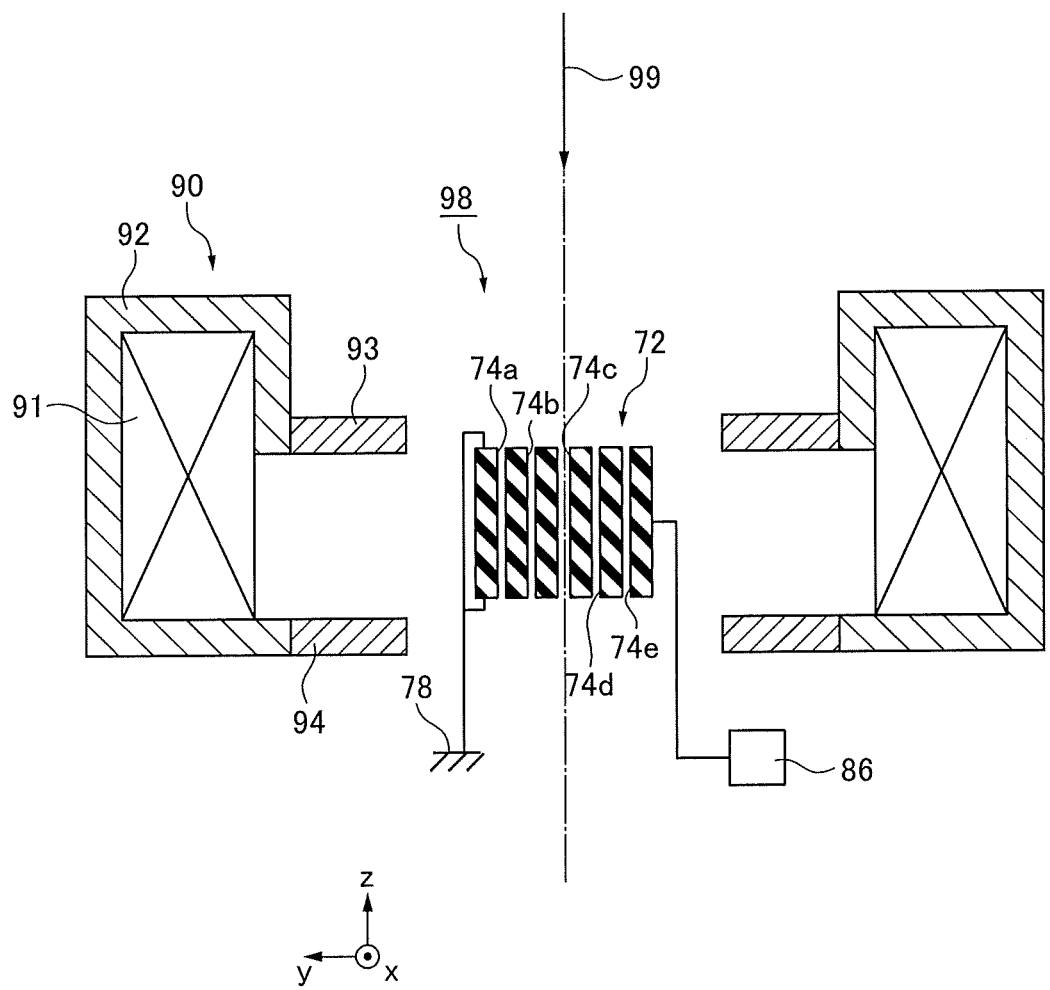
FIG. 5 is a schematic cross-sectional view of an electrostatic lens and an electromagnetic lens provided in the multiple electron beam inspection apparatus according to the embodiment.
Figure 6:
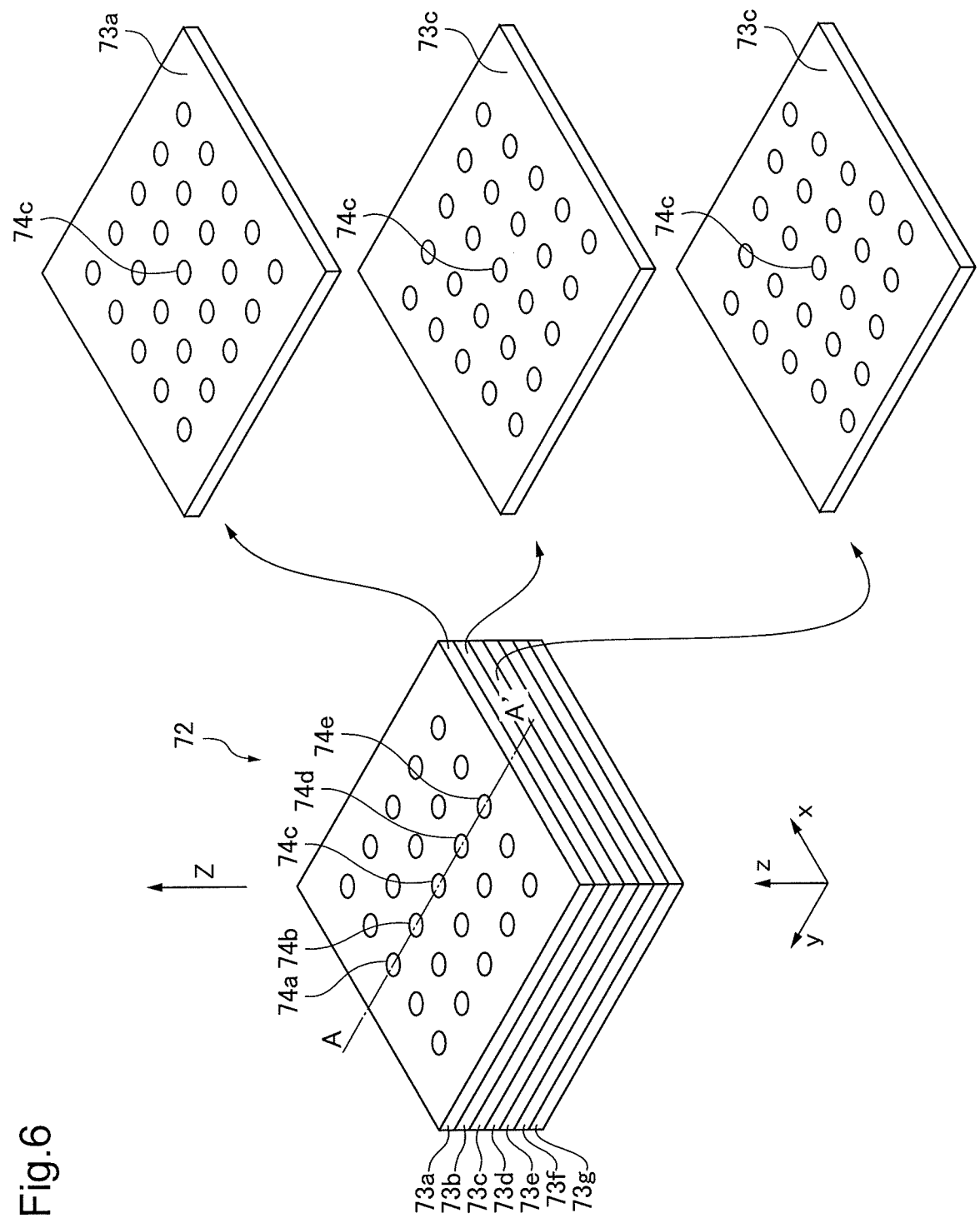
FIG. 6 is a schematic perspective view of the electrostatic lens in the embodiment.

FIG. 5 is a schematic cross-sectional view of a lens 98 provided in the inspection apparatus 100 and the electron beam column 102 (multiple beam electron lens barrel) according to the embodiment. FIG. 6 is a schematic perspective view of an electrostatic lens 72 in the embodiment. Incidentally, in FIGS. 5 and 6, the conductive film described later is not illustrated.

The lens 98 can be preferably used as the reduction lens 205, the reduction lens 213, and the objective lens 207. The lens 98 includes an electromagnetic lens (magnetic field lens) 90 and the electrostatic lens 72.

The electromagnetic lens 90 includes a coil 91, a yoke 92, a pole piece upper pole 93, and a pole piece lower pole 94. The coil 91 is formed by winding a wire such as a copper wire. The end of the wire of the coil 91 is connected to a power source (not illustrated). By allowing a current from the power source (not illustrated) to flow in the coil 91, a magnetic field is generated around the coil 91.

The yoke 92 contains a material with high magnetic permeability of, for example, permalloy (Ni—Fe alloy) or the like and allows magnetic field lines of the magnetic field generated by the coil 91 to pass through the yoke well. The magnetic field lines passing through the yoke 92 flow to the pole piece upper pole 93 and the pole piece lower pole 94 which are connected to the yoke 92 and formed by using a material having a higher quality than the yoke 92. In this manner, a lens magnetic field (not illustrated) formed by the coil 91 is concentrated and generated in an area which the multiple electron beams mainly surrounded by the pole piece upper pole 93 and the pole piece lower pole 94 can pass through. Preferably, the center of the lens magnetic field is disposed at a height position on the substrate surface.

The electrostatic lens 72 is provided in a lens magnetic field generated by an electromagnetic lens (magnetic field lens) 90. The electrostatic lens 72 has a plurality of through-holes 74 through which the respective multiple electron beams 20 can pass. In FIG. 5, through-holes 74a, 74b, 74c, 74d and 74e are illustrated. Incidentally, the through-holes 74a, 74b, 74d, and 74e actually have a spiral shape, but are illustrated as vertical holes in FIG. 5 for the convenience of description.

As illustrated in FIG. 6, a total of 25 through-holes 74 through which each of the multiple electron beams 20 formed corresponding to the 5×5 holes (openings) 22 illustrated in FIG. 2 passes are arranged in the electrostatic lens 72. Among the through-holes 74, the central through-hole 74c is a vertical through-hole which is provided in parallel to the central axis of trajectory at a position through which the central axis of trajectory 99 (or the optical axis or the central axis of trajectory of the central beam) of the multiple electron beams 20 passes. The disposition of the other 24 through-holes 74 has a spiral shape. Then, the axis of the spiral shape is parallel to the central axis of trajectory.

As an example of a method of forming the through-hole 74 having a spiral shape, there is a method of forming the through-hole by using a plurality of insulating plates 73 as illustrated in FIG. 6. The electrostatic lens 72 in the embodiment is formed by using insulating plates 73a, 73b, 73c, 73d, 73e, 73f, and 73g. Each insulating plate 73 has 5×5 through-holes.

Herein, the through-hole 74 formed in the insulating plate 73b rotates, for example, about 5 degrees in the xy plane when rotated around the through-hole 74c of the insulating plate 73b with respect to the through-hole 74 formed in the insulating plate 73a. Herein, the direction of rotation is, for example, counterclockwise when viewed from the upper side of the paper surface of FIG. 6. Next, the through-hole 74 formed in the insulating plate 73c rotates, for example, about 5 degrees in the xy plane with respect to the through-hole 74 formed in the insulating plate 73b. Herein, the direction of rotation is, for example, counterclockwise when viewed from the upper side of the paper surface of FIG. 6. Hereinafter, similarly, with respect to the insulating plate 73d, the insulating plate 73e, the insulating plate 73f, and the insulating plate 73g, the through-hole 74 is also formed. In this manner, a through-hole 74 having a spiral axis parallel to the central axis of trajectory is formed. Accordingly, a spiral shape can be formed in the state controlled easily and satisfactorily.

Incidentally, the reason why the shape of the through-hole 74 is spiral is that, since the electron beams exerted with a Lorentz force in a direction perpendicular to the traveling direction of the electron beams due to the magnetic field generated by the magnetic field lens 90 perform a spiral motion, the through-hole 74 is formed in a spiral shape in accordance with the trajectory of the electron beams.

Incidentally, the form and formation method of the electrostatic lens are not limited to those illustrated in FIG. 6. For example, an electrostatic lens maybe formed by forming an insulating material in which a through-hole having a spiral shape is formed by using a 3D printer.

The insulating plate 73 is made of, for example, ceramics such as aluminum oxide ($Al_2O_3$), aluminum nitride (AlN), zirconium oxide (ZrO). Of course, the insulating plate 73 can be preferably formed by using other insulating materials.

The thickness of the electrostatic lens 72 in the z direction (for example, the direction parallel to the central axis of trajectory 99) is not particularly limited, but is preferably, for example, about 10 mm or more and 20 mm or less. In addition, the rotation angle of the spiral shape of the through-hole 74 is not particularly limited, but is preferably, for example, about 30 degrees or more and 40 degrees or less.

In addition, it is preferable that the opening pitch of the through-holes 74 is gradually changed from the insulating plate 73a disposed on the upper side of the paper surface of FIG. 6 to the insulating plates 73b, 73c, 73d, 73e, 73f, and 73g disposed on the lower side of the paper surface of FIG. 6. For example, it is preferable that the opening pitch of the through-holes 74 in the insulating plate 73a is larger than the opening pitch of the through-holes 74 in the insulating plate 73b, the opening pitch of the through-holes 74 in the insulating plate 73b is larger than the opening pitch of the through-holes 74 in the insulating plate 73c, the opening pitch of the through-holes 74 in the insulating plate 73c is larger than the opening pitch of the through-holes 74 in the insulating plate 73d, the opening pitch of the through-holes 74 in the insulating plate 73d is larger than the opening pitch of the through-holes 74 in the insulating plate 73e, the opening pitch of the through-holes 74 in the insulating plate 73e is larger than the opening pitch of the through-holes 74 in the insulating plate 73f, and the opening pitch of the through-holes 74 in the insulating plate 73f is larger than the opening pitch of the through-holes 74 in the insulating plate 73g.

The electrostatic lens 72 is connected to a ground 78 and a power source 86.

Figure 7A:
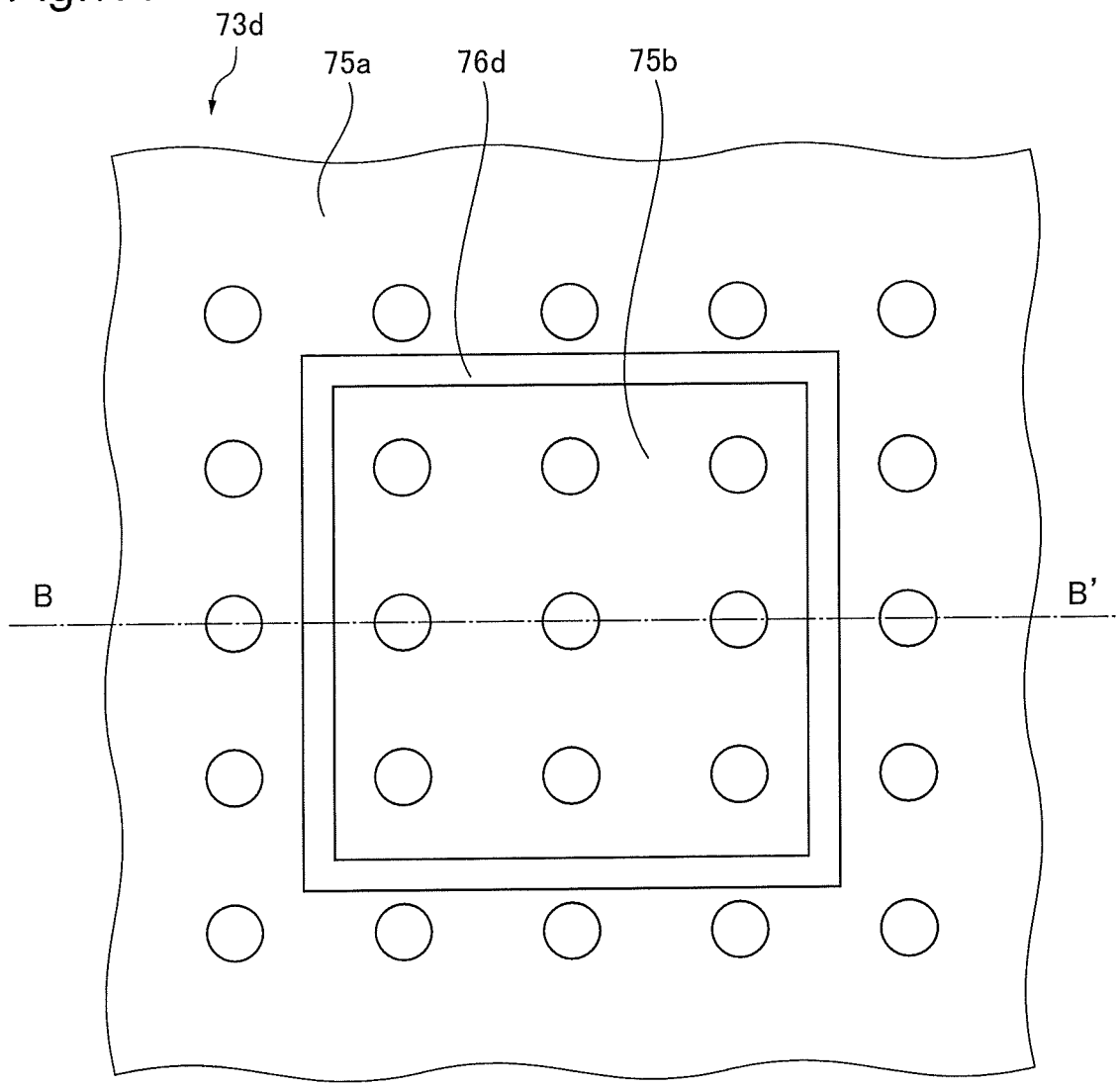
FIGS. 7A and 7B are schematic diagrams of an example of an insulating plate and a conductive film constituting the electrostatic lens in the embodiment.
Figure 7B:
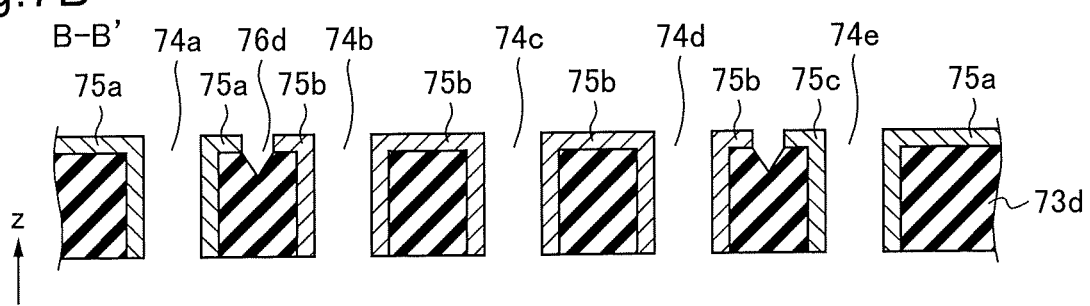

FIGS. 7A and 7B are schematic diagrams of an example of the insulating plate 73 and the conductive film 75 constituting the electrostatic lens 72 in the embodiment. In FIGS. 7A and 7B, the insulating plate 73d is illustrated as the insulating plate 73. FIG. 7A is a schematic top view when the insulating plate 73 and the conductive film 75 are viewed from the above, and FIG. 7B is a schematic cross-sectional view taken along line B-B' of FIG. 7A.

The conductive film 75 is provided on the upper surface of the insulating plate 73d and the side surface of the through-hole 74. A groove 76d is provided on the upper surface of the insulating plate 73d. In the groove 76d, the conductive film 75 is completely removed. For this reason, a conductive film 75a provided outside the groove 76d and a conductive film 75b provided inside the groove 76d are electrically insulated from each other by the groove 76d. The conductive film 75 is formed, for example, by sputtering of a metal material. Then, the conductive film 75a and the conductive film 75b are formed by forming the groove 76d.

FIG. 8 is a schematic cross-sectional view of the insulating plate 73 and the conductive film 75 constituting the electrostatic lens 72 in the embodiment. FIG. 8 is a schematic cross-sectional view in a cross section passing through the through-holes 74a, 74b, 74c, 74d, and 74e of the electrostatic lens 72. Incidentally, the through-holes 74a, 74b, 74d, and 74e actually have a spiral shape, but are illustrated as vertical holes in FIG. 8 for the convenience of description. The insulating plates 73 are used in contact with each other, but are illustrated separately in FIG. 8 for the convenience of description.

The conductive film 75a provided in the through-hole 74 is an example of an electrode.

The conductive film 75b is connected to the ground 78 (FIG. 5). The conductive film 75a is connected to the power source 86.

The insulating plate 73a is not provided with a groove 76. The conductive film 75b as the conductive film 75 is provided on the insulating plate 73a.

The insulating plate 73b is provided with a groove 76b around the through-holes 74a, 74b, 74c, 74d, and 74e. The conductive film 75a is provided outside the groove 76b, and the conductive film 75b is provided inside the groove 76b.

The insulating plate 73c is provided with a groove 76c around the through-holes 74a, 74b, 74c, 74d, and 74e. The conductive film 75a is provided outside the groove 76c, and the conductive film 75b is provided inside the groove 76c.

The insulating plate 73d is provided with a groove 76d around the through-holes 74b, 74c, and 74d. The through-hole 74a and the through-hole 74e are provided outside the groove 76d. The conductive film 75a is provided outside the groove 76d, and the conductive film 75b is provided inside the groove 76d.

The insulating plate 73e is provided with a groove 76e around the through-holes 74b, 74c, and 74d. The through-hole 74a and the through-hole 74e are provided outside the groove 76e. The conductive film 75a is provided outside the groove 76e, and the conductive film 75b is provided inside the groove 76e.

The insulating plate 73f is not provided with the groove 76. The insulating plate 73f is provided with the conductive film 75a as the conductive film 75.

The insulating plate 73g is not provided with the groove 76. The insulating plate 73g is provided with the conductive film 75b as the conductive film 75.

In addition, when the conductive film 75a and the conductive film 75b are stacked, a recess 77 of the conductive film 75 is appropriately provided so as not to allow the conductive film 75a and the conductive film 75b to be in contact with each other.

Therefore, when passing through the insulating plates 73d, 73e, and 73f, the electron beams passing through the through-holes 74a and 74e are applied with the voltage from the power source 86. In addition, when passing through the insulating plate 73f, the electron beams passing through the through-holes 74b, 74c and 74d are applied with the voltage from the power source 86. Accordingly, the conductive film 75a is used as an electrode for applying the voltage to the electron beams, and the length of the electrode for applying the voltage to the electron beams differs depending on the through-hole 74.

In addition, the insulating plate 73a and the insulating plate 73g disposed at the top and bottom of the electrostatic lens 72 are provided with the conductive film 75b connected to the ground 78 but not provided with the conductive film 75a connected to the power source 86. This is to prevent the electric field caused by the application of the voltage from the power source 86 from leaking in the vertical direction of the electrostatic lens 72 so that the trajectory of the multiple electron beams does not go wrong.

Incidentally, by appropriately providing the recesses 77, different voltages can be easily applied to the conductive films 75b provided on the side surfaces of the respective through-holes 74.

Incidentally, the structure of the electrostatic lens 72 is not limited to the above.

Next, the function and effect of the embodiment are described.

The curvature of field formed by the multiple beams increases in proportion to the square of the distance from the optical axis. It is preferable to correct the curvature of field.

In the embodiment, by combining the magnetic field lens 90 and the electrostatic lens 72, the voltage applied to each electron beam by using the electrostatic lens 72 can be reduced. For this reason, the electrostatic lens 72 can be miniaturized.

In addition, the electrostatic lens 72 has a plurality of through-holes 74 each having a spiral shape. This is because the electron beam is exerted with a Lorentz force in a direction perpendicular to the traveling direction of the electron beam by the magnetic field generated by the magnetic field lens 90 and performs spiral motion, so that the through-hole 74 is formed in a spiral shape in accordance with the trajectory of the electron beam. Herein, the trajectory of the spiral motion has a spiral shape having an axis parallel to the central axis of trajectory of the multiple electron beams. In other words, the shape of the through-hole 74 becomes a spiral shape in accordance with the direction in which the electron beam spirals. For this reason, it is preferable that the axis of the spiral shape is parallel to the central axis of trajectory of the multiple beams. Incidentally, the direction in which the spiral shape rotates is counterclockwise with respect to the traveling direction of the electron beam.

Furthermore, the power source 86 preferably applies different voltages to the respective conductive films 75*a* of the respective through-holes 74. This is because a speed difference occurs in the electron beams passing through the respective through-holes 74, and the respective electron beams are condensed at different condensing positions according to the speed difference. Therefore, since the function of condensing of each electron beam can be adjusted, it is possible to improve the irradiation accuracy of the multiple beams.

Incidentally, since the shape of the spiral trajectory is changed according to the distance from the central axis of trajectory, the voltage applied from the power source to the plurality of electrodes is changed according to the distance from the central axis of trajectory, and thus, it is preferable to increase or decrease the voltage according to the distance from the central axis of trajectory.

According to the inspection apparatus of the present embodiment, it is possible to provide the multiple beam electron lens barrel and the inspection apparatus with improved irradiation accuracy of the multiple beams.

In the above description, a series of "circuits" includes a processing circuit, and the processing circuit includes an electric circuit, a computer, a processor, a circuit board, a quantum circuit, a semiconductor device, or the like. In addition, as each "circuit", a common processing circuit (the same processing circuit) may be used. Alternatively, different processing circuits (separate processing circuits) may be used. The program for executing the processor or the like may be recorded on a recording medium such as a magnetic disk drive device, a magnetic tape device, an FD, or a read only memory (ROM). For example, the comparison circuit 108, the reference image generation circuit 112, the lens control circuit 124, the blanking control circuit 126, and the like may be configured by at least one processing circuit described above.

Heretofore, the embodiment has been described above with reference to specific examples. However, embodiments are not limited to these specific examples.

In addition, the descriptions for components and the like that are not directly required for the description of embodiments, such as a device configuration and a control method, are omitted, but a required device configuration and a required control method can be appropriately selected and used.

In the embodiments, the description of the configurations of the inspection method and the inspection apparatus, the manufacturing method thereof, and the like that are not directly required for the description of embodiments is omitted, but a required configuration of the inspection method can be appropriately selected and used. In addition, all inspection methods that include elements of embodiments and can be appropriately modified in design by those skilled in the art are included within the scope of embodiments. The scope of embodiments is defined by the appended claims and equivalents thereof.

What is claimed is:

1. A multiple electron beam inspection apparatus comprising:
   an irradiation source irradiating a substrate with multiple electron beams;
   a stage on which is capable of mounting the substrate;
   an electromagnetic lens provided between the irradiation source and the stage, the electromagnetic lens generating a lens magnetic field, the multiple electron beams being capable of passing through the lens magnetic field;
   an electrostatic lens provided in the lens magnetic field, the electrostatic lens including a plurality of through-holes and a plurality of electrodes, the plurality of through-holes having wall surfaces respectively, each of the multiple electron beams being capable of passing through the corresponding each of the plurality of through-holes, each of the plurality of electrodes provided on each of the wall surfaces of the plurality of through-holes, at least one of the through-holes provided apart from a central axis of trajectory of the multiple electron beams having a spiral shape; and
   a power source connected to the electrodes.

2. The multiple electron beam inspection apparatus according to claim 1, wherein an axis of the spiral shape is provided in parallel to the central axis of trajectory.

3. The multiple electron beam inspection apparatus according to claim 1, wherein the power source applies different voltages to the respective plurality of electrodes.

4. The multiple electron beam inspection apparatus according to claim 1, wherein lengths of the plurality of electrodes in a direction parallel to the central axis of trajectory are different from each other.

5. The multiple electron beam inspection apparatus according to claim 1, wherein a center of the lens magnetic field is disposed at a height position of a substrate surface.

6. The multiple electron beam inspection apparatus according to claim 1, wherein the electrostatic lens has a plurality of insulating plates, each of the plurality of insulating plates having a plurality of through-holes.

7. The multiple electron beam inspection apparatus according to claim 1, wherein a thickness of the electrostatic lens in a direction parallel to the central axis of trajectory is 20 mm or less.

8. The multiple electron beam inspection apparatus according to claim 1, wherein a rotation angle of the spiral shape of one of the through-holes is 40 degrees or less.

* * * * *